US007002827B1

(12) United States Patent
Sabharwal et al.

(10) Patent No.: US 7,002,827 B1
(45) Date of Patent: Feb. 21, 2006

(54) METHODS AND APPARATUSES FOR A ROM MEMORY ARRAY HAVING A VIRTUALLY GROUNDED LINE

(75) Inventors: Deepak Sabharwal, New Delhi (IN); Izak Kense, Fremont, CA (US); Alexander Shubat, Fremont, CA (US)

(73) Assignee: Virage Logic Corporation, Fremont, CA (US)

( * ) Notice: Subject to any disclaimer, the term of this patent is extended or adjusted under 35 U.S.C. 154(b) by 195 days.

(21) Appl. No.: 10/364,261

(22) Filed: Feb. 10, 2003

(51) Int. Cl.
G11C 17/00 (2006.01)

(52) U.S. Cl. .................................. 365/94; 365/185.16
(58) Field of Classification Search ................ 365/94, 365/185.16
See application file for complete search history.

(56) References Cited

U.S. PATENT DOCUMENTS

| | | | |
|---|---|---|---|
| 5,204,835 A | * | 4/1993 | Eitan ..................... 365/185.16 |
| 5,440,518 A | * | 8/1995 | Hazani ....................... 365/218 |
| 5,668,752 A | | 9/1997 | Hashimoto |
| 5,691,938 A | * | 11/1997 | Yiu et al. ............... 365/185.11 |
| 5,723,883 A | | 3/1998 | Gheewalla |
| 5,898,194 A | | 4/1999 | Gheewala |
| 5,917,224 A | | 6/1999 | Zangara |
| 5,923,059 A | | 7/1999 | Gheewala |
| 5,923,060 A | | 7/1999 | Gheewala |
| 5,926,417 A | | 7/1999 | Chang |
| 6,002,607 A | | 12/1999 | Dvir |
| 6,069,382 A | | 5/2000 | Rahim |
| 6,091,090 A | | 7/2000 | Gheewala |
| 6,445,065 B1 | | 9/2002 | Gheewala et al. |
| 6,480,432 B1 | | 11/2002 | Nakayama |
| 6,617,621 B1 | | 9/2003 | Gheewala et al. |
| 6,711,067 B1 | | 3/2004 | Kablanian |
| 6,838,713 B1 | | 1/2005 | Gheewala et al. |
| 6,853,572 B1 | | 2/2005 | Sabharwal |

* cited by examiner

Primary Examiner—Anh Phung
Assistant Examiner—Tuan T. Nguyen
(74) Attorney, Agent, or Firm—Blakely, Sokoloff, Taylor & Zafman LLP (57) ABSTRACT

Methods and apparatuses in which a ROM memory array has virtual-grounded source lines programmed in layer physically higher than the diffusion layer. The ROM memory array may include a diffusion layer, one or more virtual-grounded source lines, and one or more bit lines. At least one of the virtual-grounded source lines is programmed with a layer physically higher than the diffusion layer.

18 Claims, 7 Drawing Sheets

BASE LAYER
Figure 1

METHODS AND APPARATUSES FOR A ROM MEMORY ARRAY HAVING A VIRTUALLY GROUNDED LINE

FIELD OF THE INVENTION

Embodiments of the invention generally relate to read only memories (ROM). More particularly, an aspect of an embodiment of the invention relates to a ROM memory array that has virtual-grounded source lines programmed with a layer physically higher than the diffusion layer.

BACKGROUND OF THE INVENTION

With the explosion of wireless and portable electronic devices, some designers want to dramatically reduce the active and standby power consumption to extend battery life on many Bluetooth and 802.11b devices, as well as mobile devices such as cell phones, hearing aids, Personal Digital Assistants, or laptops. All of these devices use some memory and logic circuits.

Some T-cell based ROM memory array architectures suffer from problems such as 1) bit line coupling due to bit lines running very close to each other, 2) sub-threshold leakage in the memory array for unselected bit cells; and 3) high power consumption when the memory is in standby.

Some ROM memory arrays share source lines between memory columns. However, these ROM Memory arrays have their transistors connected to a permanently grounded source line and may suffer from excess leakage current.

A memory matrix is typically programmed upon fabrication. Generally, in the semiconductor industry, the technical operations implemented in the silicon diffusion layer, Front End, are clearly separated from the operations relative to forming metallizations and vias on the Back End. These two types of operations are performed in different sections of a same array, or even in different array.

From a practical point of view, the logic on a chip for a processor, a memory, or similar component can be prefabricated in the silicon of a diffusion layer. The steps of programming a memory array to determine the logic stored in the ROM may occur in the Back End steps. Thus, an intermediary component can be prefabricated which includes the level of the memory array, a processor, as well as other components implemented in the same integrated circuit. Upon arrival of a customer order, the logic state may be programmed into the ROM array by the metallizations, which enables much faster supply times.

SUMMARY OF THE INVENTION

Methods and apparatuses in which a ROM memory array has virtual-grounded source lines programmed with a layer physically higher than the diffusion layer. The ROM memory array may include a diffusion layer, one or more virtual-grounded source lines, and one or more bit lines. At least one of the virtual-grounded source lines is programmed with a layer physically higher than the diffusion layer.

BRIEF DESCRIPTION OF THE DRAWINGS

The drawings refer to embodiments of the invention in which.

While the invention is subject to various modifications and alternative forms, specific embodiments thereof have been shown by way of example in the drawings and will herein be described in detail. The invention should be understood to not be limited to the particular forms disclosed, but on the contrary, the intention is to cover all modifications, equivalents, and alternatives falling within the spirit and scope of the invention.

DETAILED DISCUSSION

In the following description, numerous specific details are set forth, such as examples of specific data signals, named components, connections, number of memory columns in a group of memory columns, etc., in order to provide a thorough understanding of the present invention. It will be apparent, however, to one of ordinary skill in the art that the present invention may be practiced without these specific details. In other instances, well known components or methods have not been described in detail but rather in a block diagram in order to avoid unnecessarily obscuring the present invention. Further specific numeric references such as first source line, may be made. However, the specific numeric reference should not be interpreted as a literal sequential order but rather interpreted that the first source line is different than a second source line. Thus, the specific details set forth are merely exemplary. The specific details may be varied from and still be contemplated to be within the spirit and scope of the present invention.

In general, various methods and apparatuses are described in which a ROM memory array has virtual-grounded source lines programmed in layer physically higher than the diffusion layer. In an embodiment, the Read Only Memory (ROM) memory array may include a diffusion layer, one or more virtual-grounded source lines, and one or more bit lines. The virtual-grounded source lines are programmed in a layer physically higher than the diffusion layer such as a via layer or a metal layer. A virtual-grounded source line may change its nominal voltage level from a first logic-voltage state to a second logic-voltage state in response to a read signal. The virtual grounded source line may connect to a bit cell and have a voltage level approximately equal to the voltage level on a bit line connected to the bit cell when that bit cell is not being read. The switchable voltage state of the virtual ground allows consumption of leakage current to be minimized when the bit cell is not being read.

Figure 1:
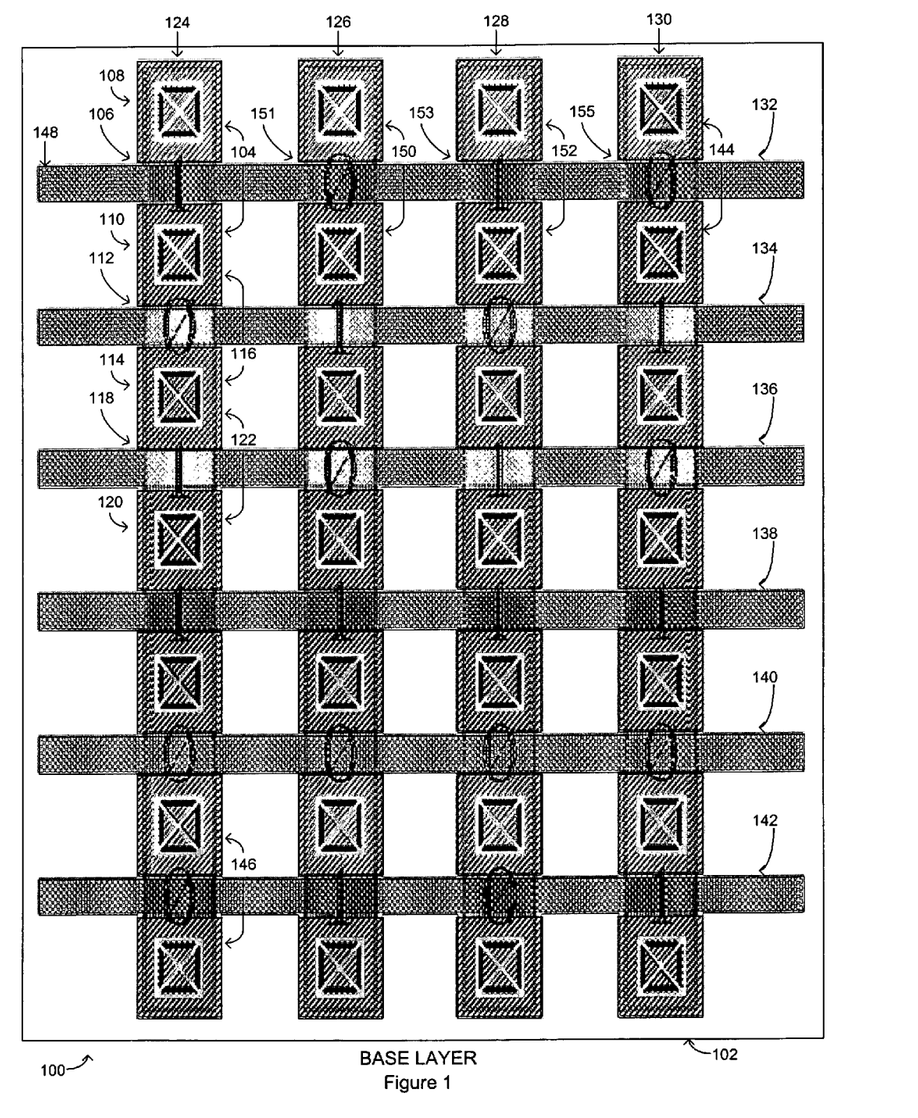
FIG. 1 illustrates a physical layout of an embodiment of a ROM memory array which uses a virtual grounding technique and programs in a layer physically higher than the diffusion layer.

FIG. 1 illustrates a physical layout of an embodiment of a ROM memory array that uses a virtual grounding technique and programs in a layer physically higher than the diffusion layer. The example ROM memory array 100 has a base layer or also called the diffusion layer 102. Transistor junctions may be formed by doping the substrate in the diffusion layer 102. The diffusion layer 102 contains multiple bit cells such as a first bit cell 104. Each bit cell includes a source terminal, a drain terminal and a gate connection. The first bit cell 104 is made up of the first gate terminal 106, which is in between the first source terminal 108 and the first drain terminal 110. The first bit cell 104 shares the first drain terminal 110 with the second gate terminal 112 and second source terminal 114 of the second bit cell 116. The second bit cell 116 shares the second source terminal 114 with the third gate terminal 118 and second drain terminal 120 of the third bit cell 122. For an embodiment, this pattern repeats itself as the source terminals and drain terminals for bit cells in each bit cell column are shared along that bit cell column.

The example ROM memory array 100 includes an array of rows of bit cells and columns of bit cells. The example ROM memory array 100 has an example number of four vertical columns of bit cells 124, 126, 128, 130 and six horizontal rows of bit cells 132, 134, 136, 138, 140, 142 being formed in the diffusion layer 102. A first row of bit cells 132 includes horizontal bit cells from the first bit cell 104 across to the nineteenth bit cell 144. A first column of bit cells 124 includes bit cells in a vertical direction from the first bit cell 104 through the sixth bit cell 146. Programming of source lines and bit lines to connect to these bit cells occurs in a layer physically higher than the diffusion layer 102.

A word line made of a conductive material such as polysilicon may be connected horizontally across the gate terminals of the bit cells in each row of bit cells. For example, a first word line 148 may connect to the first gate terminal 106 of the first bit cell 104, the seventh gate terminal 151 of the seventh bit cell 150, the thirteenth gate terminal 153 of the thirteenth bit cell 152, and the nineteenth gate terminal 155 of the nineteenth bit cell 144.

Figure 2:
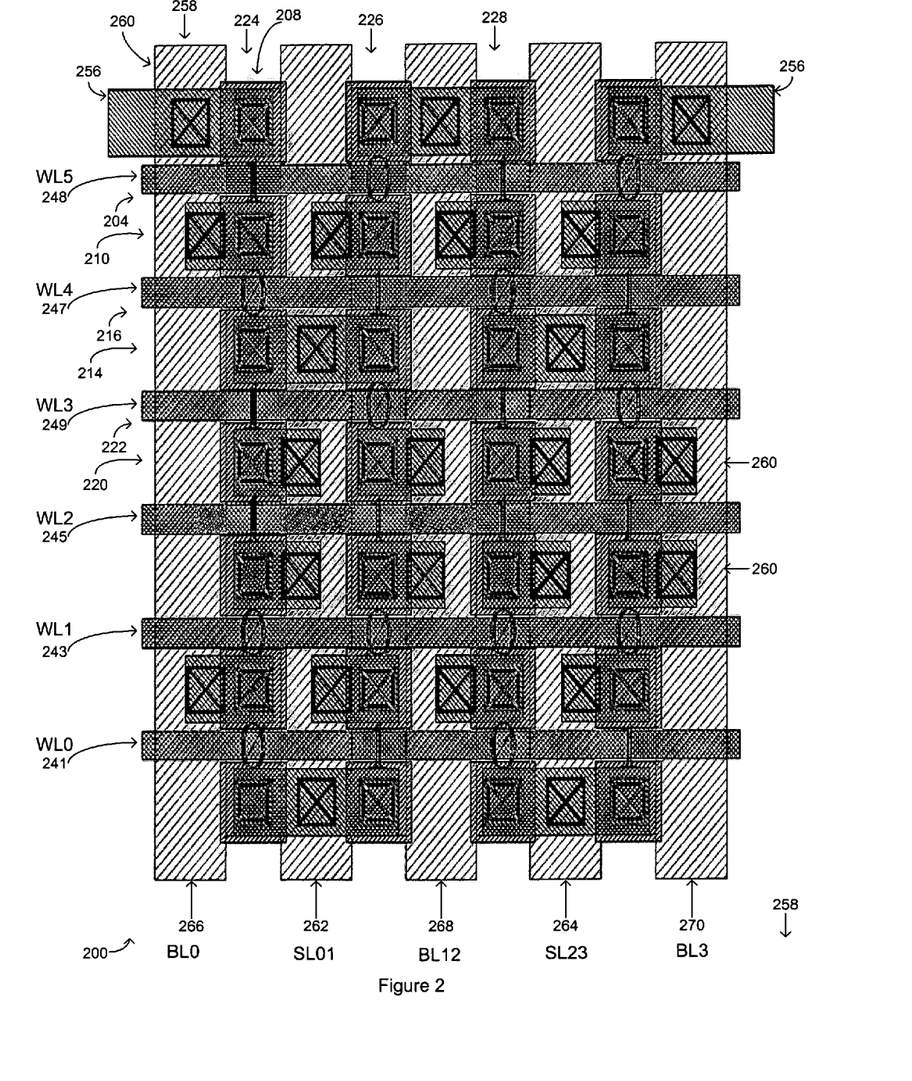
FIG. 2 illustrates a physical layout of an embodiment of a ROM memory array having source lines and bit lines programmed in a layer above the diffusion layer.

FIG. 2 illustrates a physical layout of an embodiment of a ROM memory array having source lines and bit lines programmed in a layer above the diffusion layer. The example ROM memory array 200 includes components such as: a diffusion layer; a metal two layer 256, a metal three layer 258, and a via layer 260 above the diffusion layer; one or more virtual-grounded source lines 262, 264; one or more bit lines 266, 268, 270; and one or more word lines 241, 243, 245, 247, 248, 249. The virtual-grounded source lines 262, 264 and bit lines 266, 268, 270 are programmed in the layers 256, 258, 260 physically higher than the diffusion layer. Thus, programming of source line and bit lines in the ROM memory with one or more of the layers above the diffusion layer may occur on the back end of the fabrication process.

Note, the via layer 260 is indicated by rectangular boxes with an X in the box. Rectangular boxes with narrowly spaced hash marks going to the right indicate the metal two layer 256. Rectangular boxes with broadly spaced hash marks going to the left indicate the metal three layer 258. The bit cells of the diffusion layer are shown underneath a metal 2 layer 256, a metal 3 layer 258, and a via layer 260.

The bit lines and the source lines position above and offset with respect to the active columns of bit cells. A single bit line may connect to bit cells from two active columns and position roughly in between those two active columns. Bit cells from two different active columns of bit cells may also share a single source line. However, in a group of three columns of bit cells, the single bit line and corresponding source line would only share the center column of bit cells in common.

For example, the first source line 262 connects to the first column of bit cells 224 and the second column of bit cells 226. Similarly, each bit line except for the furthest on the left and the furthest on the right bit line may connect to two active columns of bit cells. Thus, the second column of bit cells 226 and third column of bit cells 228 connect to second bit line 268.

The source lines and the bit lines are parallel to each other and every other vertical line is a source line. An equal distance separates the spacing between the bit lines and the source lines. Thus, the bit lines and source lines may be functionally interchangeable and easily manufacturable because, in some cases, the only difference may be the voltage source connections made to these lines. For example, a virtual-ground circuit may connect to a virtual-grounded source line to change the source line's nominal voltage level from a first logic voltage state, such as Vdd, to a second logic voltage state, such as Vss, upon receiving a read signal.

Programming through routing of the source lines and bit lines to the bit cells may occur through using vias, metal layers, or a combination of vias and metal layers. Logical ones may be programmed by connecting both terminals, the source terminal and drain terminal, of that bit cell to either the adjacent source line or the adjacent bit line. For example, the first ROM bit cell 204 may be programmed permanently to a logical 1 by connecting the first source terminal 208 and the first drain terminal 210 to the first bit line 266 using, for example, a combination of vias 260 and metal layers 256, 258. Connecting both terminals of the bit cell across the source line to the bit line may program logical zeros. Thus, the source terminal of a bit cell connects to either an adjacent source line or an adjacent bit line and the drain terminal to the other line. For example, the second bit cell 216 is programmed permanently to a logical 0 because the first bit line 266 connects through the metal 3 layer 258 to the shared first drain terminal 210 and the shared second source terminal 214 connects through the metal 3 layer 258 to the first source line 262. The shared second source terminal 214 may connect from the diffusion layer through the metal two layer and the via layer to the first source line 262 on the metal three layer. Similarly, the shared drain terminal 210 may connect through the metal two layer and the via layer to the first bit line 266 on the metal three layer. The connection across the bit line to the source line programs that bit cell to a logical 0.

In the same way, the third active bit cell 222 is programmed to a logical 1. The shared second source terminal 214 and the shared second drain terminal 220 of the third bit cell 222 are both connected using the metal two and via 23 layers to the same source line on the metal three layer, such as the first source line 262. Thus, both terminals of an active bit cell can be tied either to the same bit line or both terminals tied to the same source line in order for that bit cell to permanently store a logical 1.

For an embodiment, each bit line may be composed of two conductive strips with multiple interconnections between the strips to form a single bit line. Each source line may be composed of two metal strips with multiple interconnections connected at regular intervals and at the bottom between the strips to form a single source line. The ROM memory may have roughly an equal number of source lines and bit lines. The structure of the ROM memory yields beneficial results in that leakage current from the memory location is minimized, the array may take up a small amount of area in a System On a Chip implementation, as well as many other benefits.

Figure 3:
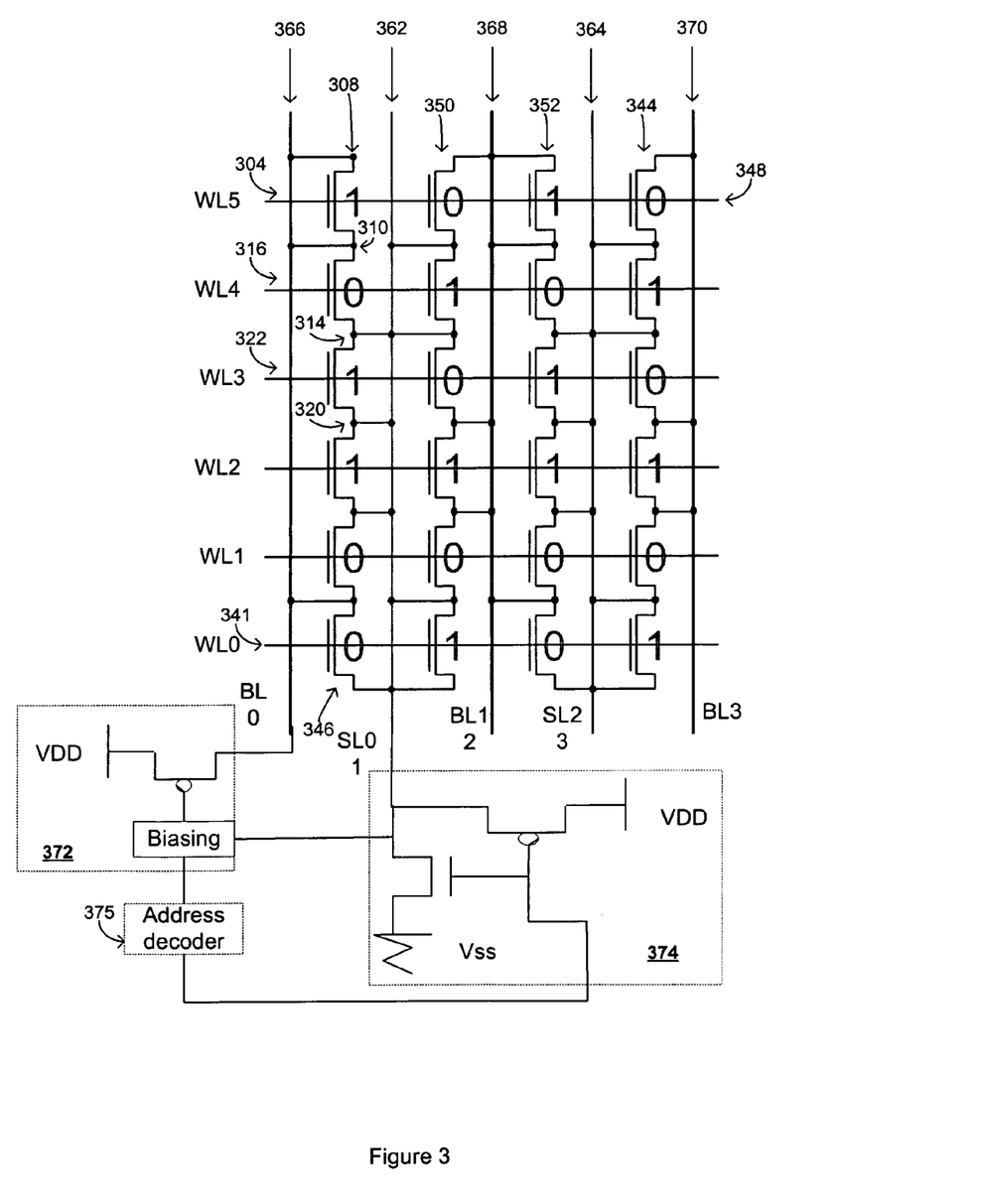
FIG. 3 illustrates a partial schematic diagram an embodiment of a ROM memory array such as the ROM memory array shown in FIG. 1 and FIG. 2.

FIG. 3 illustrates a partial schematic diagram an embodiment of a ROM memory array such as the ROM memory array shown in FIG. 1 and FIG. 2. Thus, the first bit cell 304 stores a logical 1 because the first source terminal 308 and the first drain terminal 310 connect to the first bit line 366. The second bit cell 316 stores a logical 0 because the shared first drain terminal 310 connects to the first bit line 366 and the shared second source terminal 314 connects to the first virtually grounded source line 362. The third bit cell 322 stores a logical 1 because the shared second source terminal 314 and the shared second drain terminal 320 both connect to the first virtually grounded source line 362.

In addition, a precharge switch 372 may connect to each bit line 366, 368, 370 in the ROM memory array 300. A virtual ground circuit 374 may connect to each source line 362, 364 in the ROM memory array 300.

The virtual ground circuit 374 controls the virtual ground operation. The virtual ground circuit 374 receives a control signal from the address decoder circuitry that a read operation is commencing on a bit cell associated with a particular source line. The virtual ground circuit 374 then changes the source line's nominal voltage level from a first logic voltage state to a second logic voltage state upon receiving a read signal. A precharge switch 372 delays switching off the precharge voltage supplied to the bit line in order to reduce coupling noise from an adjacent source line.

In standby, the bit lines and the source lines adjacent to a given bit cell may be maintained at a first voltage state such as the power supply voltage, Vdd. Also, the gate terminal of the given bit cell, through the word line, is turned off until a read operation occurs. The precharge switch 372 may supply a precharge voltage to the bit lines.

During a read operation, based on the address of a bit cell being read, then the address decoder circuitry 375 activates the virtual ground circuit 374 to bring the voltage down low on the source line corresponding to the address of the bit cell being read. The address circuitry 375 also activates the word line going to the gate of the bit cell being read in the memory array. The word line changes its voltage level in response to the read signal. The word line, for example the sixth word line 341, couples that change of voltage to the gates of the bit cells in that row of bit cells. The address circuitry 375 also supplies a signal to precharge switch 372 that the precharge voltage supplied to the bit line corresponding to the bit cell being addressed should be disabled. This results in the voltage state of the bit line being pulled low if the location is programmed as a 0 or remains high if the location is programmed as a 1. The logic state permanently stored by the bit cell is read out by pulling up the voltage level on the word line for the row being accessed, pulling down the voltage level on the source line for the column being read, and reading the data indication off the bit line for that bit cell column.

When the word line is asserted on a bit cell programmed as a zero, then the bit cell electrically connects its corresponding bit line to its corresponding source line. For example, the sixth word line 341 may be asserted during a read operation on the sixth bit cell 346. The sixth bit cell 346 electrically connects the first bit line 366 to the first virtual grounded source line 362. When the word line is asserted on a bit cell programmed as a one, then the bit line adjacent to that bit cell does not change its voltage state level because no connection exists between that bit line and the source line being brought low.

As discussed, multiple bit cells, such as the first bit cell 304, the seventh bit cell 350, the thirteenth bit cell 352, and the nineteenth bit cell 344 connect to a word line, such as first word line 348. For a read operation of a bit cell, at least two but less than all of the bit cells in the multiple bit cells may be read when the virtual-grounded source line shared by the at least two bit cells changes its nominal voltage level during a read operation. For example, if the address circuitry 375 asserts the first word line 348 and activates the first virtual grounded source line 362, then the data stored by the first bit cell 304 and the seventh bit cell 350 may be read off the first bit line 366 and second bit line 368, respectively. However, the virtual ground source lines, such as the second source line 364, for the remaining bit cells connected to that word line maintain their nominal voltage to eliminate any possible leakage current in those bit cells. For a read of multiple bit cells, such as eight bit cells, then merely four source line would be brought to a low voltage state and the data for these eight bit cells would be sensed.

The precharge switch 372 may delay switching off the precharge voltage supplied to the bit line in order to reduce coupling noise from an adjacent virtual-grounded source line. The precharge switch 372 may include a metal oxide semiconductor field effect transistor or similar device MOSFET that holds the bit line at a high voltage state until the MOSFET receives an input that indicates that the source line has been brought to an approximately low voltage state.

Note, merely an example precharge switch 372 and an example virtual ground circuit 374 are illustrated however each bit line and source line may connect to such a circuit.

Figure 4:
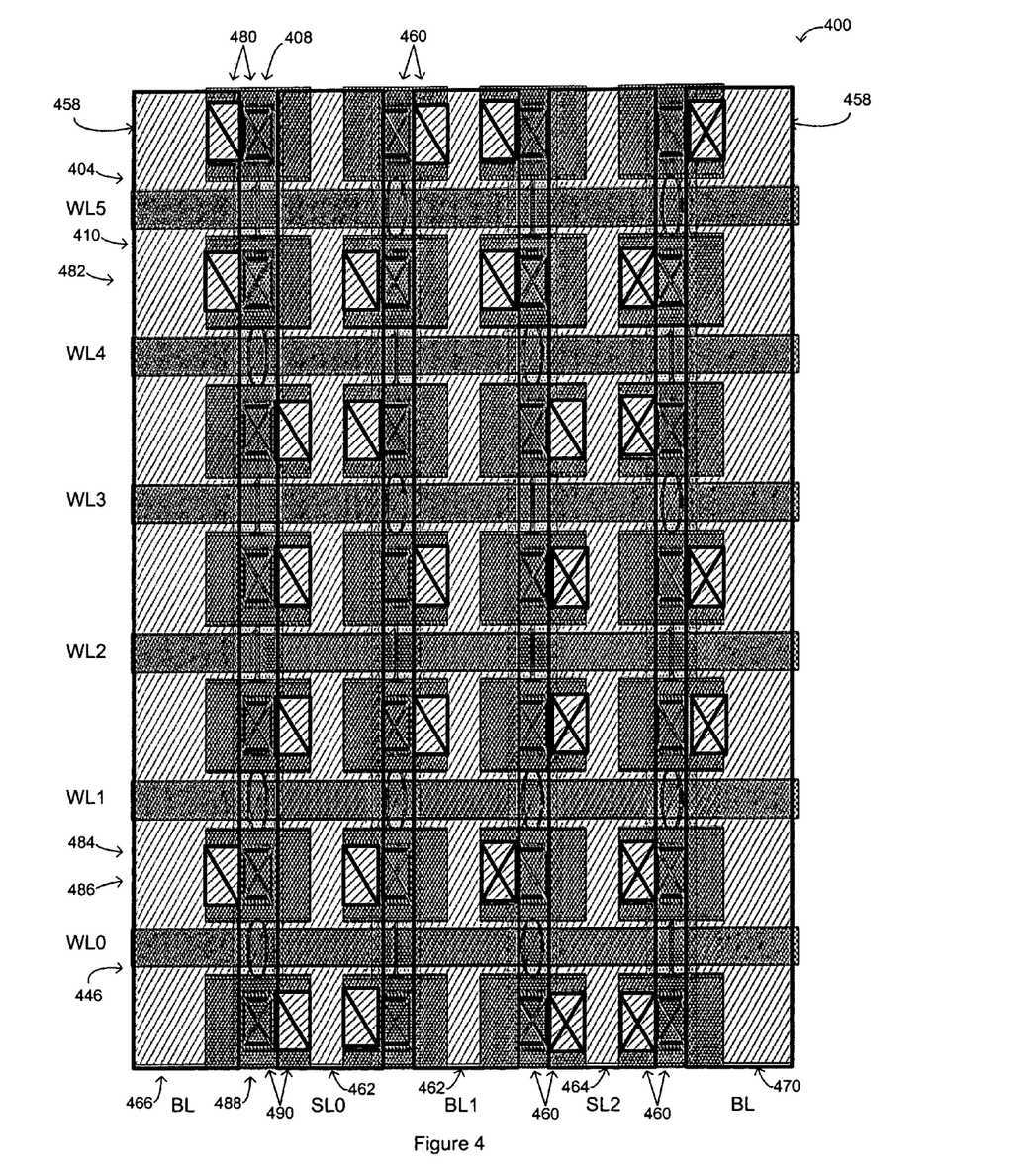
FIG. 4 illustrates a physical layout of an embodiment of a ROM memory array programmed using via layers to connect to the bit lines and virtual-grounded source lines.

FIG. 4 illustrates a physical layout of an embodiment of a ROM memory array programmed using via layers to connect to the bit lines and virtual-grounded source lines. The example ROM memory array 400 may include bit lines 466, 468, 470 and virtual grounded source lines 462,464 routed in the metal three layer 458, bit cells formed in the diffusion layer, and vias 460 used to connect the terminals of the bit cells to the lines 462, 464, 466, 468, 470 in the metal three layer 458. A section of the ROM memory array 400 may have three bit lines, first bit line 466, second bit line 468, and third bit line 470, and two source lines, a first source line 462 and a second source line 464.

In this example, the formation of the bit cells in the diffusion layer is the same as in FIGS. 1 and 2. The logic permanently stored in the bit cells is the same as in FIGS. 1–3. However, the layers above the diffusion layer used to program the bit cells differ from FIGS. 1–3. The programming of the bit cells may be accomplished by using solely via mask customization.

The first source terminal 408 in the first bit cell 404 may use a first via 480 to connect the first bit line 466 in the metal three layer 458. Similarly, the first drain terminal 410 of the first bit cell 404 uses a second via 482 to connect to the first bit line 466 in the metal three layer 458. Thus, the first bit cell 404 is programmed to store a logical one.

The sixth bit cell 446 stores a logical 0 because the third drain terminal 484 uses a third via 486 to connect the first bit line 466 in the metal three layer 458 and the fourth source terminal 488 uses a fourth via 490 to connect to the first virtual grounded source line 462 in the metal three layer 458. Thus, the ROM memory array 400 may be programmed using vias, metal layers and vias, or another similar method.

In an embodiment, a ROM memory array having a virtual grounded line may reduce power consumption because merely the bit cell being read will discharge. The ROM memory array having a virtual grounded line may reduce bit line coupling problems by holding un-selected bit lines at a high voltage state. The ROM memory array having a virtual grounded line may eliminate standby sub-threshold leakage in the array because the source lines and the bit lines are maintained at approximately the same voltage level. The ROM memory array having a virtual grounded line may implemented to have a smaller or almost the same area on a chip as a T-cell based array.

For example, the area occupied by a T-cell using via programming may be 1.711 sq um. The equivalent bit cell using a virtual grounded line with via programming may occupy 1.7136 sq um. Moreover, the area occupied by a bit cell using a virtual grounded line with metal layer and via layer programming may be 1.4076 sq um.

Figure 5:
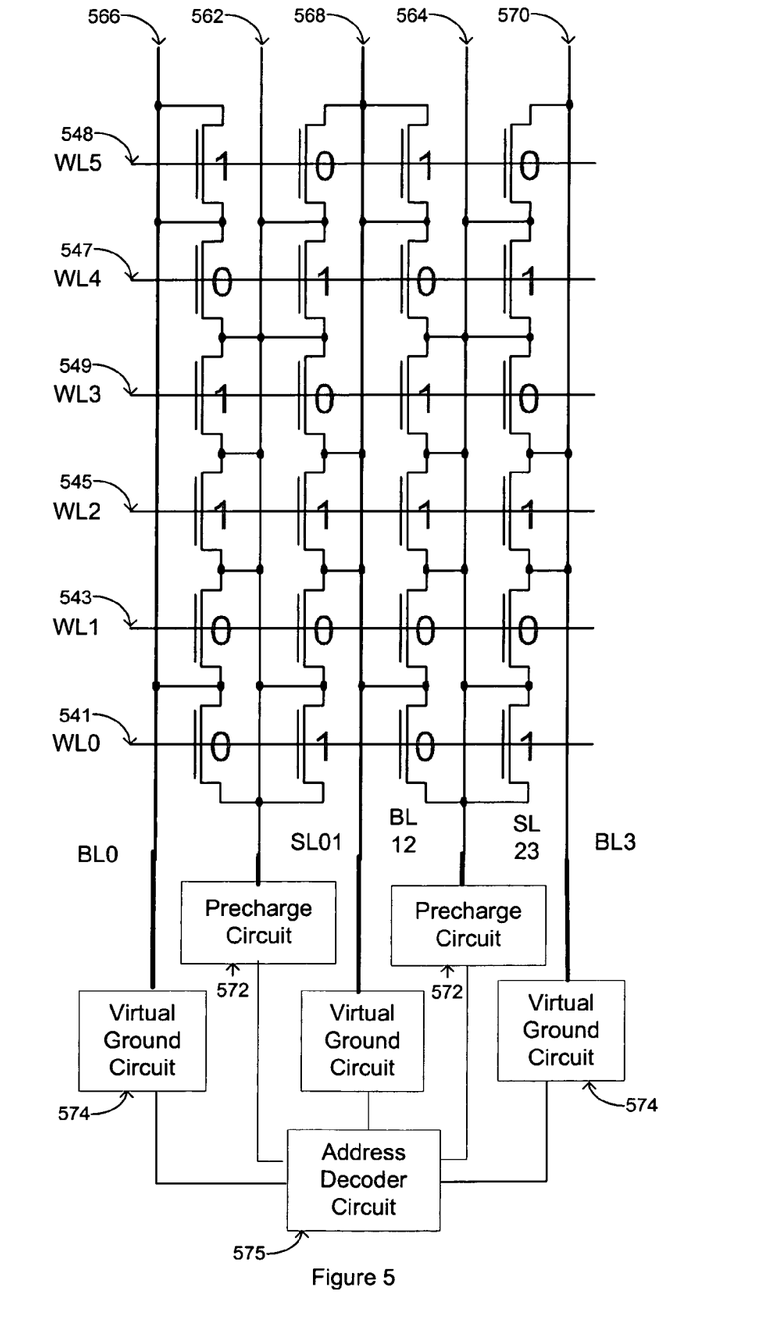
FIG. 5 illustrates a partial schematic diagram of an embodiment of a ROM memory array such as the ROM memory array shown in FIG. 4.

FIG. 5 illustrates a partial schematic diagram of an embodiment of a ROM memory array such as the ROM memory array shown in FIG. 4. In an embodiment, the ROM memory 500 may include six word lines 541, 543, 545, 547, 548, 549, two source lines 562, 564 coupled to a precharge circuit 572, and three bit lines 566, 568, 570 coupled to a virtual ground circuit 574. The operation of this circuit is similar to that described in FIG. 3, however when the memory is in standby, then the source lines and bit lines may be maintained at a low voltage state, such as Vss. The virtual ground circuit 574 may supply a high voltage such as Vdd, when a read signal is received.

The virtual ground circuit 574 may be implemented using transistors, Boolean logic circuits, or other similar components. The address decoder circuit 575 may be implemented using transistors, Boolean logic circuits, or other similar components.

Figure 6:
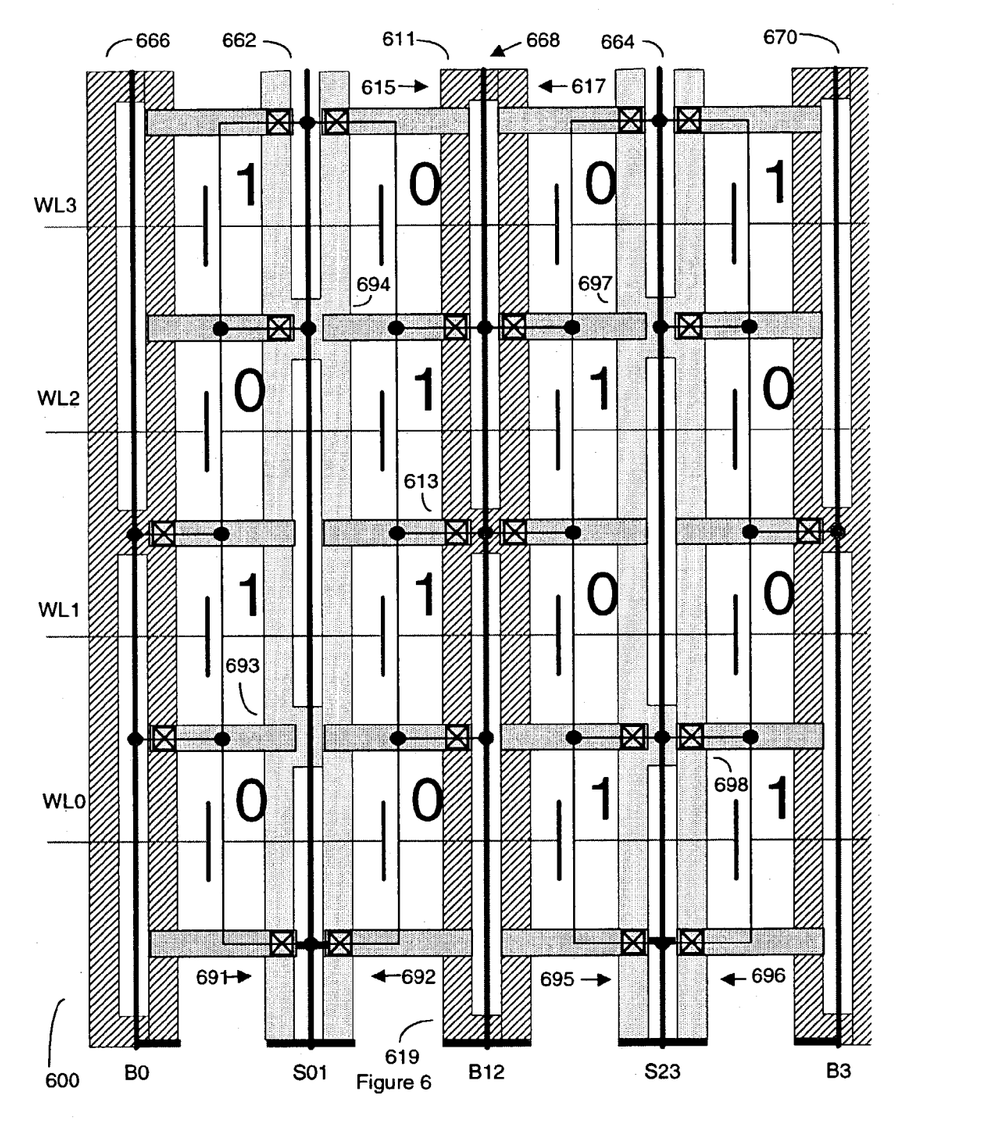
FIG. 6 illustrates an embodiment of a ROM memory array having the bit line is formed from at least two conductive strips with multiple interconnections between the strips to form the bit line.

FIG. 6 illustrates an embodiment of a ROM memory array having the bit line is formed from at least two conductive strips with multiple interconnections between the strips to form the bit line. A source line or bit line may be formed from at least two conductive strips with multiple interconnections between the strips to form the source line. The conductive strips may be connected by the interconnections at regular intervals and at the bottom.

For example, the first source line 662 may have two conductive strips 691, 692 connected with a first interconnection 693 and a second interconnection 694. The second source line 664 may have two conductive strips 695, 696 connected with a third interconnection 697 and a fourth interconnection 698. Similarly, the second bit line 668 may have two conductive strips 615, 617 connected with an fifth interconnection 611, a sixth interconnection 613, and a seventh interconnection 619.

The bit lines and source lines may be cut through the center and the two halves of each connected at the bottom. The bit/source lines formed from at least two conductive strips with multiple interconnections may have: a lower capacitance value and a higher resistance value then lines formed from a single solid conductive strip. Thus, the bit/source lines formed from at least two conductive strips with multiple interconnections will have a lower capacitance value and higher resistance value in the RC delay product. Also, splitting each source line and bit line into two halves may be implemented with little to no penalty of increasing the ROM memory array 600 layout area.

The bit lines 666, 668, 670 and source lines 662, 664 are above and offset with respect the adjacent columns of bit cells in the diffusion layer.

Figure 7:
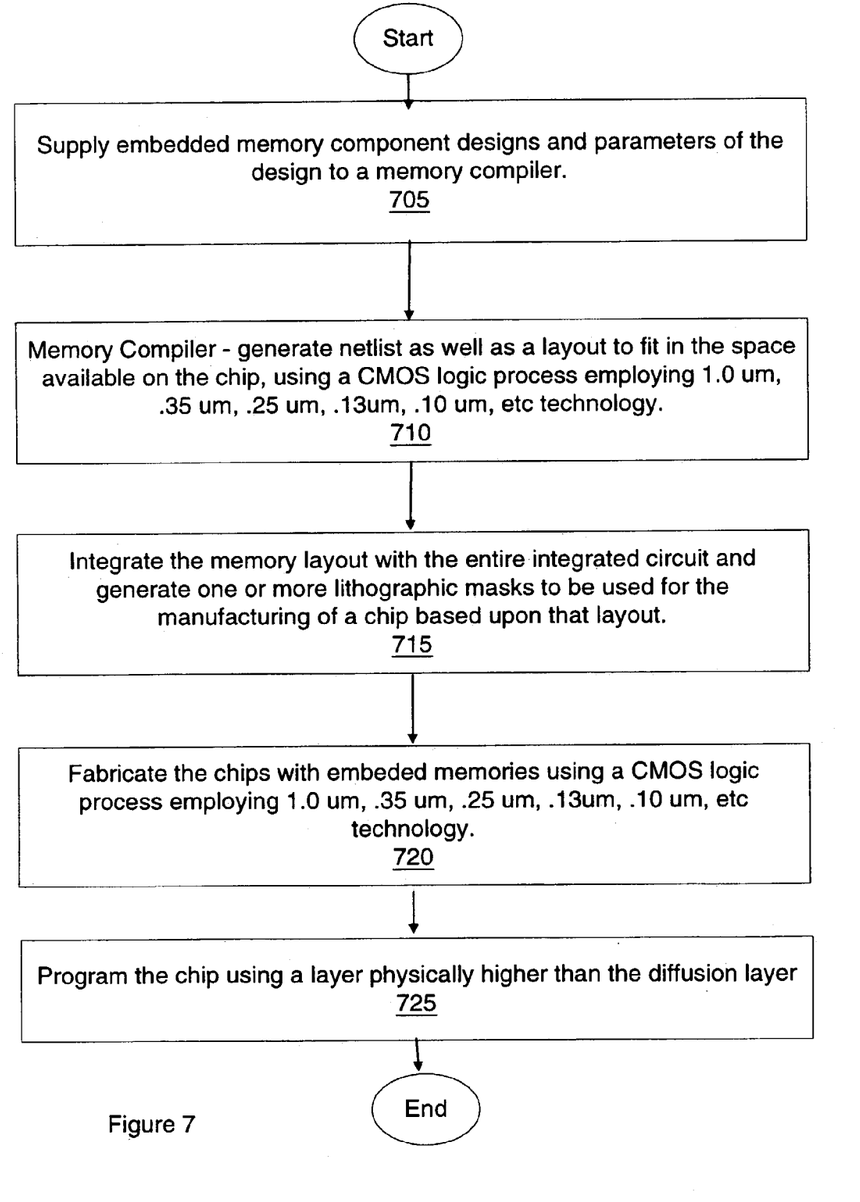
FIG. 7 illustrates an example process of generating an embedded memory from designs of memory components with an embodiment of a memory compiler.

FIG. 7 illustrates an example process of generating an embedded memory from designs of memory components with an embodiment of a memory compiler.

In block 705, the designs for each memory component for the embedded memory are supplied to the memory compiler, as well as other design parameters such as the number of columns and number of rows of the array, the available size on the chip and other parameters. Thus, the designs for one or more ROM memory arrays having a diffusion layer 102 and one or more virtual-grounded lines programmed in a layer physically higher than the diffusion layer 102 may be supplied to the memory compiler. A memory compiler may be a software program comprised of multiple algorithms and designs for the purpose of generating a circuit design and a layout in a space available on a target chip. The set of application-specific algorithms and interfaces of the memory compiler may be used by system IC integrators to rapidly create hundreds of silicon-proven memory cores. The memory compiler receives the memory component designs and utilizes those memory component designs in conjunction with memory circuit designs to optimize a circuit design and layout in the space available on a target chip.

In block 710, the memory compiler generates a netlist and a layout targeted to fit in the space available on a target chip. The memory compiler stores the data representing the embedded memory typically on a machine-readable medium. The memory compiler selects the memory component building blocks so that they are sized appropriate for the targeted fabrication technology. The memory compiler then provides the memory layout to be used to generate one or more lithographic masks to be used in the fabrication of that embedded memory. The memory compiler also provides a netlist for verification of the embedded memory.

In block 715, the memory layout generated is integrated with the rest of the layout for the chip and a machine generates the lithographic masks that contain the information necessary for the fabrication of a functional device. The machine generates one or more lithographic masks to be used to transfer that circuit design onto the chip. The non-volatile memory solution for embedded applications integrates easily with the standard single poly CMOS processes.

In block 720, a fabrication facility fabricates the chips with the embedded memories using the lithographic masks generated from the memory compiler's circuit design and layout. Fabrication facilities may use a standard CMOS logic process having minimum line widths such as 1.0 um, 0.50 um, 0.35 um, 0.25 um, 0.18 um, 0.13 um, 0.10 um, 90 nm, or less, to fabricate the chips. The size of the CMOS logic process employed typically defines the smallest minimum lithographic dimension that can be fabricated on the chip using the lithographic masks, which in turn determines minimum component size. In an embodiment, light is shown through these lithographic masks onto the chip to transfer the circuit design and layout for the embedded memory onto the chip itself. In an embodiment, the virtual ground non-volatile memory cell compiler is designed for embedded applications in the standard CMOS logic process.

In block 725, the chip may be programmed in the back end of the fabrication process using a layer physically higher than the diffusion layer. The ROM memory Compiler may generate instances that may be programmed by a ROM programming tool. The ROM Compiler uses routing and cell architecture that allows designers to create custom designs with just a few metal layers and via masks. The via layer and/or metal layer programmed cells may be completed in the back-end of the manufacturing process. If the programming of the ROM memory isn't made until later or a revision is needed, then the designer merely has to redesign the block, a few metal and via masks, thereby preserving all of the other masks.

In one embodiment, the software used to facilitate the memory compiler can be embodied onto a machine-readable medium. A machine-readable medium includes any mechanism that provides (e.g., stores and/or transmits) information in a form readable by a machine (e.g., a computer). For example, a machine-readable medium includes read only memory (ROM); random access memory (RAM); magnetic disk storage media; optical storage media; flash memory devices; DVD's, electrical, optical, acoustical or other form of propagated signals (e.g., carrier waves, infrared signals, digital signals, EPROMs, EEPROMs, FLASH, magnetic or optical cards, or any type of media suitable for storing electronic instructions. Slower mediums could be cached to a faster, more practical, medium.

In an embodiment, an example memory compiler may comprise the following. A graphic user interface, a common set of processing elements, and a library of files containing design elements such as circuits, control logic, and cell arrays that define the complier. In an embodiment, object code in a set of executable software programs.

As noted, in an embodiment, a designer chooses the specifics of the memory configuration to produce a set of files defining the requested memory instances. A memory instance may include front end views and back end files. The front end views support documentation, simulation, debugging, and testing. The back end files, such as a layout, physical LEF, etc are for layout and fabrication.

The memory complier outputs may include Behavioral Models and Test Benches (Verilog, VHDL), •Timing Models (TLF, Lib and STAMP), Test Models (MemBIST, FastScan), Structural Netlists (EDIF, Spice), Power Models (Watt-Watcher, ALF), Floorplanning and Place&Route Models, Physical LEF, FRAM, Layout (GDS), Datasheets (including power, timing, and area specifications, as well as other outputs. When programming occurs or if a revision is needed, the designer merely has to redesign the block, a few metal and via masks.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussions, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers, or other such information storage, transmission or display devices.

While some specific embodiments of the invention have been shown the invention is not to be limited to these embodiments. For example, the voltage used with the components may be reversed. A bit line may connect and be controlled by the virtual ground circuit. The routing of the source lines and the bit lines in a particular metal layer may change. The metal layers may be replaced with another conductive layer. The invention is to be understood as not limited by the specific embodiments described herein, but only by scope of the appended claims.

The invention claimed is:

1. An apparatus, comprising:
   a ROM memory array having a diffusion layer, one or more virtual-grounded source lines, and one or more bit lines, wherein the ROM memory array includes an array of rows of bit cells and columns of bit cells, each column of bit cells arranged so source terminals and drain terminals for two or more bit cells in a bit cell column are shared along the bit cell column, and wherein at least one or more of the virtual-grounded source lines are programmed with a layer physically higher than the diffusion layer.

2. The apparatus of claim 1, wherein a first bit cell column and a second bit cell column connect to a first bit line.

3. The apparatus of claim 2, wherein the first bit cell column and a third bit cell column connect to a first virtual-grounded source line.

4. The apparatus of claim 1, wherein the layer physically higher than the diffusion layer is a metal layer.

5. The apparatus of claim 1, wherein the layer physically higher than the diffusion layer is a metal two layer.

6. The apparatus of claim 1, wherein the layer physically higher than the diffusion layer is a via layer.

7. The apparatus of claim 1, wherein the one or more virtual-grounded source lines include a first virtual-grounded source line, and the first virtual-grounded source line to change its nominal voltage level from a first voltage state to a second voltage state in response to a read signal.

8. The apparatus of claim 1, further comprising:
   a first word line; and
   a plurality of bit cells connected to the first word line, wherein at least two but less than all of the bit cells in the plurality of bit cells may be read when a virtual-grounded source line shared by the at least two bit cells changes its nominal voltage level during a read operation.

9. The apparatus of claim 1, wherein an equal distance separates spacing between the one or more bit lines and the one or more virtual-grounded source lines.

10. The apparatus of claim 1, wherein the virtual-grounded source lines and the bit lines are parallel to each other and every other vertical line is a virtual-grounded source line.

11. A machine readable medium that stores data representing an integrated circuit, comprising:
   a ROM memory array having a diffusion layer, one or more virtual-grounded source lines, and one or more bit lines, wherein at least one or more of the virtual-grounded source lines are programmed in a layer physically higher than the diffusion layer and wherein the ROM memory array includes a first column of bit cells that includes a first bit cell, a second bit cell and a third bit cell, wherein the first bit cell shares its source terminal with the second bit cell and its drain terminal with the third bit cell.

12. The machine readable medium of claim 11, wherein the machine readable medium comprises a memory compiler to provide a layout utilized to generate one or more lithographic masks used in the fabrication of the ROM memory.

13. The machine readable medium of claim 12, wherein the virtual-grounded source lines include a first virtual-grounded source line that connects to a first bit cell column and a second bit cell column and the bit lines include a first bit line that connects to the second bit cell column and a third bit cell column.

14. The machine readable medium of claim 12, wherein at least one of the virtual-grounded source lines is programmed with a metal layer.

15. The machine readable medium of claim 12, wherein at least one of the virtual-grounded source lines is programmed with a via layer.

16. The machine readable medium of claim 12, wherein at least one of the virtual-grounded source lines is formed from at least two conductive strips with multiple interconnections between the strips to form the source line.

17. A ROM memory array having a diffusion layer, one or more virtual grounded source lines, one or more bit lines, and a switch to delay switching off a precharge voltage supplied to a first bit line in order to reduce coupling noise from an adjacent virtual-grounded source line, wherein at least one or more of the virtual-grounded source lines are programmed with a layer physically higher than the diffusion layer.

18. A ROM memory array having a diffusion layer, one or more virtual-grounded source lines, and one or more bit lines, wherein at least one or more of the virtual-grounded source lines are programmed with a layer physically higher than the diffusion layer and the one or more bit lines include a first bit line that is formed from at least two conductive strips with multiple interconnections between the strips.

* * * * *